United States Patent
Wottrich

[19]

[11] Patent Number: 6,054,931
[45] Date of Patent: Apr. 25, 2000

[54] SELF-IDENTIFYING CIRCUIT BREAKER

[75] Inventor: Joachim Wottrich, La Grange Park, Ill.

[73] Assignee: NTC, Inc., Morris, Ill.

[21] Appl. No.: 08/927,249

[22] Filed: Sep. 11, 1997

[51] Int. Cl.[7] .................................................. G08B 21/00
[52] U.S. Cl. ........................... 340/638; 324/529; 324/528
[58] Field of Search ...................................... 340/638, 635, 340/654, 639; 324/529, 528, 527, 512, 66, 67

[56]  References Cited

U.S. PATENT DOCUMENTS

| | | | |
|---|---|---|---|
| 4,082,995 | 4/1978 | Rhude | 324/51 |
| 4,121,152 | 10/1978 | Hale et al. | 324/66 |
| 4,129,825 | 12/1978 | Brinegar | 324/52 |
| 4,556,839 | 12/1985 | George | 324/66 |
| 4,734,638 | 3/1988 | Weber | 324/66 |
| 4,775,832 | 10/1988 | Pecukonis | 324/67 |
| 4,801,868 | 1/1989 | Brooks | 324/66 |
| 4,804,907 | 2/1989 | Pecukonis | 324/67 |
| 4,906,938 | 3/1990 | Konopka | 324/529 |
| 5,352,985 | 10/1994 | Simon | 324/716 |
| 5,422,564 | 6/1995 | Earle et al. | 324/67 |
| 5,493,206 | 2/1996 | Boons | 324/66 |
| 5,497,094 | 3/1996 | George | 324/529 |

FOREIGN PATENT DOCUMENTS 1162811  8/1969  United Kingdom .

Primary Examiner—Jeffery A. Hofsass
Assistant Examiner—Sihong Huang
Attorney, Agent, or Firm—Wallenstein & Wagner, Ltd.

[57]  ABSTRACT

The present invention relates to an electronic system incorporated into a circuit interrupter device to identify the circuit interrupter device associated with a particular power outlet receptacle.

25 Claims, 1 Drawing Sheet

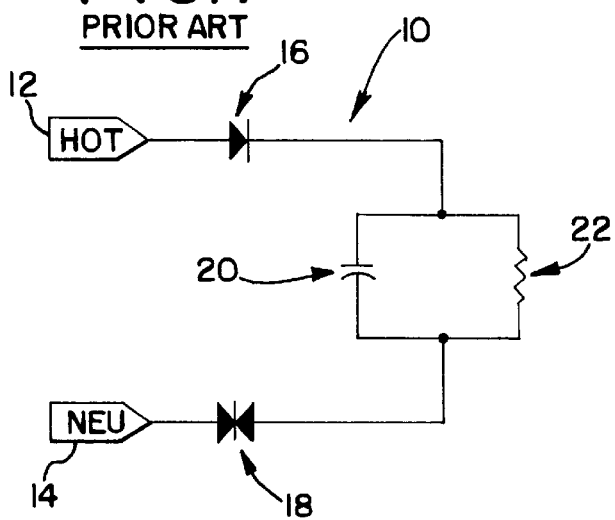
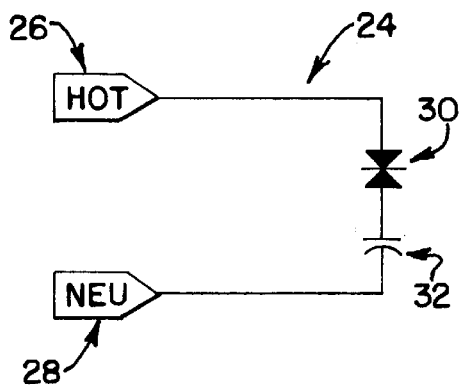
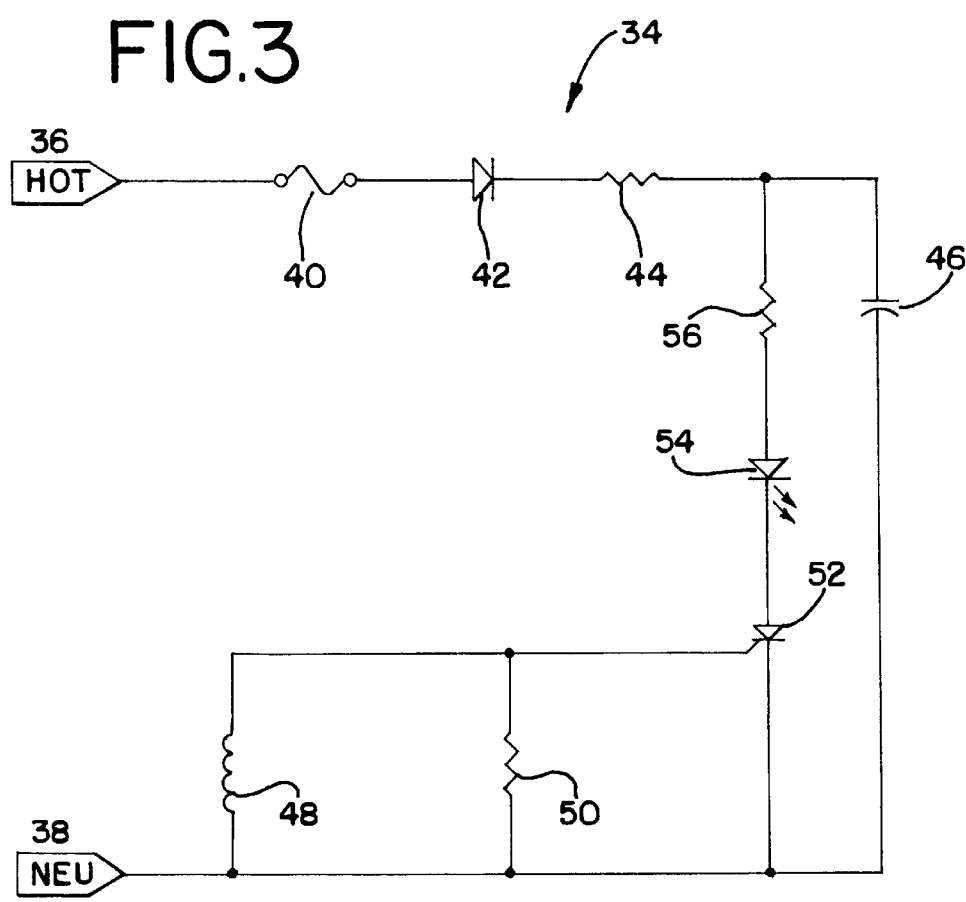

SELF-IDENTIFYING CIRCUIT BREAKER

TECHNICAL FIELD

The present invention relates generally to AC power line testing equipment and, more particularly, to an AC power circuit identifying device. Specifically, the present invention is used to identify the circuit interrupter device associated with a particular power outlet receptacle.

BACKGROUND OF THE INVENTION

When work is performed on an electrical system in a building or facility, it is necessary to trace and identify which circuit interrupter device (e.g., circuit breaker or fuse) is protecting a particular power outlet receptacle or electrical component. Manual identification of the fuse or circuit breaker can be accomplished by removing each fuse or opening each circuit breaker, thereby disrupting the power flow through the circuit. Each outlet must subsequently be examined to determine whether the power to the outlet has been disconnected. This method is not only time consuming, but also may not be feasible in situations where it would be hazardous to interrupt the power flow to certain outlets, e.g., in a hospital or in an environment where computers are in use with no backup power.

Alternatively, a variety of circuit testers are available for identifying the fuse or circuit breaker that is supplying power to a particular outlet receptacle. These testers employ an assortment of techniques to distinguish one circuit breaker from the rest. For example, the testers disclosed in U.S. Pat. Nos. 4,906,938 and 5,497,094 use a relaxation oscillator to apply an identification signal comprising a large amplitude current pulse of very short duration to the circuit. A schematic diagram of the transmitter 10 disclosed in U.S. Pat. No. 4,906,938 is shown in FIG. 1. The terminals 12, 14 of transmitter 10 are connected to the outlet or light fixture to be tested. Diode 16 acts as a half-wave rectifier. Specifically, if the voltage across diode 16 is positive, diode 16 acts as a short circuit, and if the voltage across diode 16 is negative, diode 16 acts as an open circuit. Diac 18 is a short circuit when the voltage thereacross reaches its threshold value of 120–135 volts, and is an open circuit when the current through diac 18 drops below the minimum holding current of the device. Thus, in this arrangement, diac 18 acts as a trigger switch.

If a conventional power line voltage is applied to transmitter 10, diac 18 will initially go into conduction when the line voltage reaches approximately 120 volts. This causes capacitor 20 to immediately charge to the line voltage, resulting in a large amplitude current pulse which is used to identify the circuit. Diac 18 will continue conducting until the current approaches 0 amps, i.e., approximately 50–150 milliamps, which occurs near the peak of the power line voltage. When diac 18 is switched off, capacitor 20 will be charged at a voltage level close to the peak voltage, i.e., approximately 150 volts, and can only discharge through resistor 22. Due to the relatively large resistance of resistor 22, the discharge of capacitor 20 will be slow.

Because capacitor 20 remains charged at approximately 150 volts, as the line voltage decreases from 150 volts to 0 volts and continues through its negative cycle, the voltage across diode 16 is negative. Thus, diode 16 remains an open circuit and capacitor 20 continues to discharge slowly through resistor 22.

During the next cycle, diode 16 becomes a short circuit when the line voltage surpasses the charge on the capacitor 20. Diac 18 will remain an open circuit, however, because the voltage across diac 18, which is the difference between the line voltage and the voltage across capacitor 20, will not reach its threshold value. Thus, transmitter 10 will not conduct any current until the voltage across capacitor 20 has time to discharge through resistor 22, which does not occur for a number of cycles. This results in a frequency of current spikes less than the power line frequency of 60 hertz.

The identification signals, i.e., the series of current spikes, create strong magnetic fields that will likely be sensed in the vicinity of a number of circuit interrupter devices, including the device that is actually connected to the transmitter. In order to isolate the specific circuit interrupter device, the end user must use a receiver to scan all of the circuit interrupter devices. Circuit identifiers which are currently available consist of two separate hand held units, a transmitter to generate an identification signal and a receiver to receive the signal over the AC wiring. Many of the hand-held receivers currently available require manual calibration or the use of a signal strength meter.

Further, circuit identifiers which are currently available rely entirely upon the detection of a magnetic field to indicate the presence of an identification signal. To properly scan a circuit breaker or fuse panel, the receiver must be held perpendicular to the circuit breaker or fuse in order to detect the magnetic field. If the user inadvertently holds the receiver parallel to the circuit breaker or fuse, the receiver will not detect the presence of a magnetic field.

SUMMARY OF THE INVENTION

The present invention is directed to an electronic system for identifying a circuit breaker associated with a particular outlet. Unlike the circuit identifiers currently on the market, the self-identifying circuit breaker of the present invention does not require a separate hand-held receiver to identify the correct circuit interrupting device, nor does it require manual calibration or the use of a signal strength meter. Rather, the self-identifying circuit breaker has a signal detection device installed directly within a circuit breaker. Thus, in a typical breaker box having a plurality of circuit breakers, a corresponding signal detection device is installed directly within each breaker.

To operate the self-identifying circuit breaker of the present invention, a transmitter which creates an identification signal on the circuit is connected to a power outlet receptacle. Conventional transmitters may be used in the present invention. Preferably, however, the transmitter disclosed below is used in the present invention. Because each self-identifying circuit breaker has its own indicator, e.g., a light emitting diode (LED), the user merely scans the circuit breakers visually to determine which circuit breaker is associated with a particular power outlet receptacle. The present invention does not necessitate interrupting the circuit or any other circuits.

According to a the present invention, an identification signal is transmitted from the outlet to the circuit interrupter device. The identification signal is sensed within the circuit interrupter device, and a user is alerted.

Other features and advantages of the invention will be apparent from the following detailed description taken in conjunction with the drawings.

BRIEF DESCRIPTION OF THE DRAWINGS

FIG. 1 is a schematic diagram of a conventional transmitting device;

FIG. 2 is a schematic diagram of a preferred transmitting device in accordance with the present invention; and FIG. 3 is a schematic diagram of a signal detection device to be placed within a circuit interrupter device in accordance with the present invention.

DETAILED DESCRIPTION OF THE PREFERRED EMBODIMENT

While this invention is susceptible of embodiments in many different forms, there will herein be described in detail a preferred embodiment of the invention with the understanding that the present disclosure is to be considered as an exemplification of the principles of the invention and is not intended to limit the broad aspects of the invention to the embodiment illustrated.

FIG. 2 illustrates a transmitting device 24 in accordance with the present invention. The terminals 26, 28 of transmitting device 24 are connected to the outlet or electrical fixture to be tested, where terminal 26 is the hot terminal and terminal 28 is the neutral terminal. Diac 30 in series with capacitor 32 is connected across terminals 26, 28.

In operation, when a conventional power line voltage is applied to transmitting device 24, diac 30 will initially go into conduction when the line voltage reaches approximately 120 volts. Diac 30 switches on through a negative resistance region to a low on-state voltage. This causes capacitor 32 to immediately charge to the line voltage, resulting in a large amplitude current pulse which is used to identify the circuit. Diac 30 will continue conducting until the current approaches 0 amps, which occurs near the peak of the power line voltage. When diac 30 is switched off, capacitor 32 will be charged at a voltage level close to the peak voltage, i.e., approximately 150 volts.

As the power line voltage decreases from 150 volts to approximately 30 volts, the voltage across diac 30, which is the difference between the line voltage and the voltage across capacitor 32, does not exceed its threshold voltage. Thus, diac 30 remains an open circuit and capacitor 32 remains charged. When the line voltage reaches approximately 30 volts, the voltage across diac 30 reaches approximately −120 volts. Thus, diac 30 becomes a short circuit, allowing capacitor 32 to discharge quickly and result in a negative current spike. Due to the limited charge on capacitor 32, the negative current spike may be smaller than the positive current spike created when charging capacitor 32. As the capacitor 32 discharges to 0 volts, diac 30 again becomes an open circuit.

A similar pattern will result in the opposite direction for the negative line voltages. Thus, bidirectional current spikes are formed. This continuous action results in the formation of an identification signal on the circuit, which produces a corresponding magnetic field around the signal carrying wire. Thus, diac 30 controls the charging of capacitor 32, which serves as the waveshaper of the unit. Preferably, diac 30 is manufactured by Teccor and marketed under part number P1100EA70. With P1100EA70, diac 30 will go into conduction when the line voltage reaches approximately ±90–125 volts.

FIG. 3 is a schematic diagram of a signal detection device 34 to be installed within a circuit breaker so as to make the circuit breaker self-identifying. Terminals 36 and 38 are connected to the hot and neutral terminals of the self-identifying circuit breaker. The hot terminal 36 is contiguous with the breaker-box bus-bar, and the neutral terminal 38 pig-tail wires to the neutral bus-bar. Fuse 40 protects the device 34 from damage caused by component failure, power surges, etc. Diode 42, resistor 44 and capacitor 46 comprise a classic half-wave rectifier power supply which provides the necessary DC power to operate the device 34.

The current entering the circuit breaker flows in close proximity to inductor 48. Resistor 50 is parallel to inductor 48. The presence of an identification signal, or a series of current spikes, is detected by inductor 48, which acts as a simple inductive pickup. The resulting current in inductor 48 produces a positive-going pulse which triggers a sensitive-gate silicon-controlled rectifier (SCR) 52. SCR 52 acts as a switch, allowing current to flow through SCR 52, light-emitting diode (LED) 54 and resistor 56. Resistor 56 is a current-limiting resistor. LED 54 identifies the circuit breaker as that which is connected to the transmitter. The value of inductor 48 is chosen to limit the recognition of the identification signal to the circuit breaker attached to the transmitter.

It will be understood that the invention may be embodied in other specific forms without departing from the spirit or central characteristics thereof. The present embodiment, therefore, is to be considered in all respects as illustrative and not restrictive, and the invention is not to be limited to the details given herein.

What I claim is:

1. An electronic system for identifying a circuit interrupter device associated with an outlet, comprising:
   transmitting means for transmitting an identification signal from the outlet to the circuit interrupter device;
   sensing means located within the circuit interrupter device for sensing the identification signal; and
   alert means within the circuit interrupter device for alerting a user when said sensing means senses the identification signal.

2. The electronic system as claimed in claim 1, wherein the sensing means comprises an inductor.

3. The electronic system as claimed in claim 1, wherein the alert means comprises a light emitting diode.

4. The electronic system as claimed in claim 1, wherein the identification signal comprises a series of current spikes.

5. The electronic system as claimed in claim 1, wherein the transmitting means comprises a diac in series with a capacitor.

6. The electronic system as claimed in claim 1, further comprising a switch to allow current to turn on the alert means when said sensing means senses the identification signal.

7. The electronic system as claimed in claim 6, wherein said switch comprises a silicon-controlled rectifier.

8. The electronic system as claimed in claim 1, wherein the circuit interrupter device is self-identifying.

9. A signal detection device for identifying a circuit interrupter device associated with an outlet, wherein an identification signal is transmitted from the outlet to the circuit interrupter device, the signal detection device comprising:
   sensing means located within the circuit interrupter device for sensing the identification signal; and
   alert means within the circuit interrupter device for alerting a user when said sensing means senses the identification signal.

10. The signal detection device as claimed in claim 9, wherein the sensing means comprises an inductor.

11. The signal detection device as claimed in claim 9, wherein the alert means comprises a light emitting diode.

12. The signal detection device as claimed in claim 9, wherein the identification signal comprises a series of current spikes.

13. The signal detection device as claimed in claim 9, further comprising a switch to allow current to turn on the alert means when said sensing means senses the identification signal.

14. The signal detection device as claimed in claim 13, wherein said switch comprises a silicon-controlled rectifier.

15. The signal detection device as claimed in claim 9, wherein the circuit interrupter device is self-identifying.

16. A method for identifying a circuit interrupter device associated with an outlet, comprising the steps of:

transmitting an identification signal from the outlet to the circuit interrupter device;

sensing the identification signal using sensing means located within the circuit interrupter device; and alerting a user when said sensing means senses the identification signal.

17. The method as claimed in claim 16, wherein the identification signal is sensed by an inductor.

18. The method as claimed in claim 16, wherein the user is alerted by a light emitting diode.

19. The method as claimed in claim 16, wherein the identification signal comprises a series of current spikes.

20. The electronic system as claimed in claim 16, wherein the identification signal is transmitted by a diac in series with a capacitor.

21. A signal detection device for identifying a circuit breaker associated with an outlet, wherein an identification signal is transmitted from the outlet to the circuit breaker, the signal detection device comprising:

an inductor located within the circuit breaker;

a switch; and an indicator, wherein said switch turns said indicator on in response to said inductor sensing the identification signal.

22. The signal detection device as claimed in claim 21, wherein said switch comprises a silicon-controlled rectifier.

23. The signal detection device as claimed in claim 21, wherein the indicator comprises a light emitting diode.

24. The signal detection device as claimed in claim 21, wherein the identification signal comprises a series of current spikes.

25. The signal detection device as claimed in claim 21, wherein the circuit breaker is self-identifying.

\* \* \* \* \*